United States Patent
Ji et al.

(10) Patent No.: US 6,477,630 B2
(45) Date of Patent: *Nov. 5, 2002

(54) HIERARCHICAL ROW ACTIVATION METHOD FOR BANKING CONTROL IN MULTI-BANK DRAM

(75) Inventors: Brian Ji, Fishkill, NY (US); Toshiaki Kirihata, Poughkeepsie, NY (US); Dmitry Netis, Beacon, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/257,146

(22) Filed: Feb. 24, 1999

(65) Prior Publication Data

US 2002/0026556 A1 Feb. 28, 2002

(51) Int. Cl.[7] .......................... G06F 13/00; G06F 1/10; G11C 11/413
(52) U.S. Cl. ....................... 711/167; 711/5; 365/230.03; 365/230.06; 365/230.08; 365/189.05; 713/500
(58) Field of Search ................ 711/5, 167; 365/230.03, 365/230.06, 230.08, 189.05; 713/500

(56) References Cited

U.S. PATENT DOCUMENTS

| | | | |
|---|---|---|---|
| 4,602,356 A | | 7/1986 | Nozaki et al. ......... 365/230.02 |
| 4,839,856 A | | 6/1989 | Tanaka ........................ 711/211 |
| 5,088,061 A | | 2/1992 | Golnabi et al. ........ 365/189.01 |
| 5,386,579 A | | 1/1995 | Bourekas et al. ............. 712/43 |
| 5,420,995 A | | 5/1995 | Taguri ........................ 711/211 |
| 5,691,949 A | * | 11/1997 | Hively et al. .......... 365/230.03 |
| 5,959,929 A | * | 9/1999 | Cowles et al. ......... 365/230.03 |
| 6,009,501 A | * | 12/1999 | Manning .................... 711/167 |
| 6,038,634 A | * | 3/2000 | Ji et al. .......................... 711/5 |

* cited by examiner

Primary Examiner—Do Hyun Yoo
Assistant Examiner—Mehdi Namazi
(74) Attorney, Agent, or Firm—Daryl K. Neff; Todd M. C. Li; McGinn & Gibb PLLC (57) ABSTRACT

A memory structure comprises a plurality of banks (each of the banks including a plurality of blocks) a plurality of timing critical address lines connected to all of the blocks in respective ones of the banks (a number of the critical address lines being equal to a number of the banks), and a plurality of dedicated address lines connected to respective ones of the blocks.

12 Claims, 9 Drawing Sheets

HIERARCHICAL ROW ACTIVATION METHOD FOR BANKING CONTROL IN MULTI-BANK DRAM

BACKGROUND OF THE INVENTION

1. Field of the Invention

The present invention relates generally to multi-banked dynamic random access memory (DRAM) devices and more specifically to a hierarchical row selection method and circuit for local activation of a memory array block.

2. Description of the Related Art

Figure 1A:
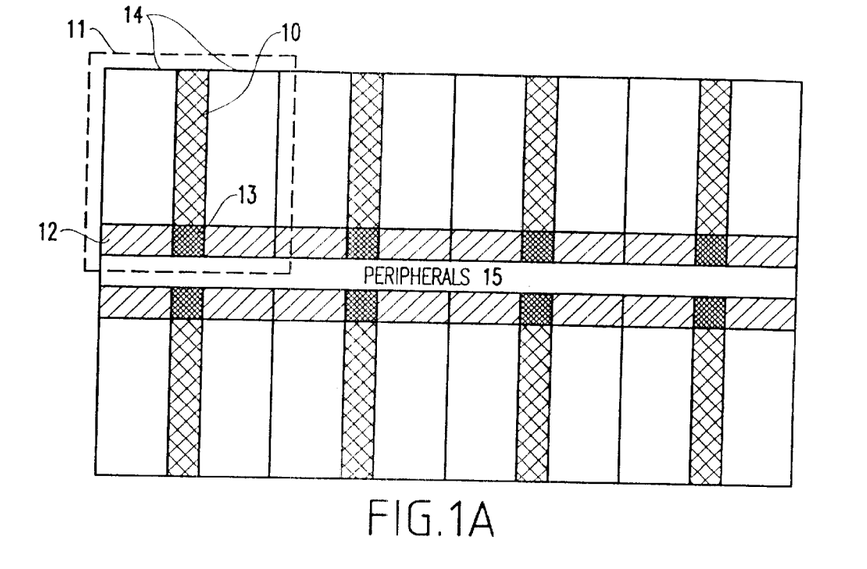
FIGS. 1A–1C are schematic diagrams of a hypothetical multi-bank DRAM.

FIG. 1A shows the configuration of a multiple bank 1 Gbit DRAM integrated circuit chip for purposes of illustration. This DRAM chip is not admitted to be prior art. The chip consists of eight 128 Mb double units 11. Four 128 Mb double units 11 are arranged in each top and bottom half of the DRAM chip. The peripheral circuits 15 are located between the top and the bottom of the chip, where a plurality of address lines (i.e. 16 row address lines), a data bus (i.e. 32 data for ×32 organization), and control signals are arranged. These signals control the eight 128 Mb double-units 11 for data read and write operations. The 128 Mb double unit 11 includes two 64 Mb units 14, a row decoder block (RDEC 10), column decoder block (CDEC) 12, and address pre-decoder block (PDEC) 13.

Figure 1B:
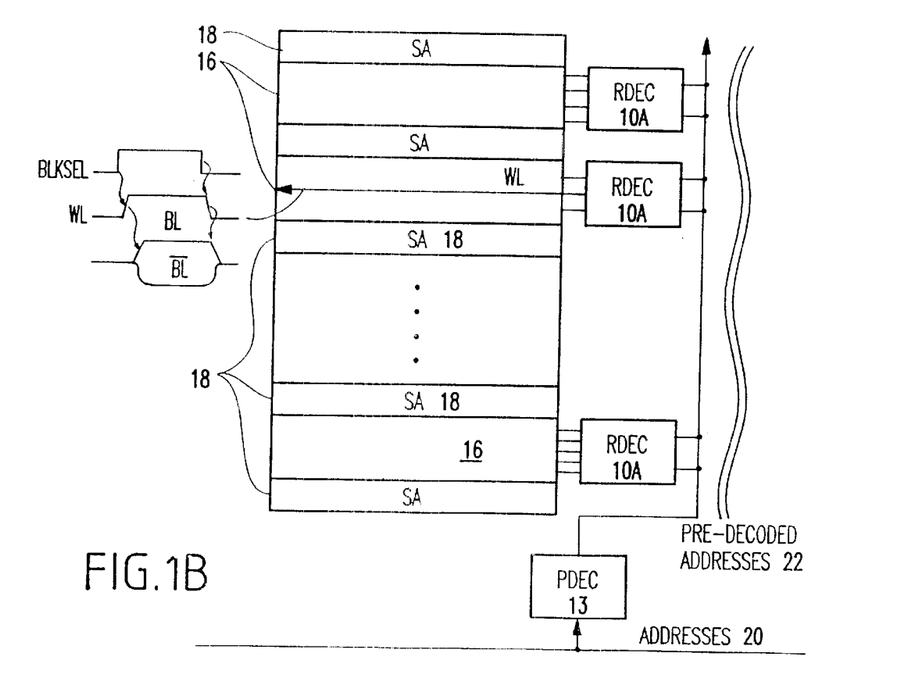

FIG. 1B is a detailed block diagram showing a portion of the 128 Mb double unit, in which the right 64 Mb unit and CDEC 12 are not shown for ease of illustration and explanation. The 64 Mb unit includes a plurality of the blocks 16 (e.g. 16 blocks of 4 Mb capacity each). Each block 16 includes a plurality of memory cells (for example, each block contains 4 M cells) which are arranged in x rows (e.g. 1024 rows) by y columns (e.g. 4096 columns) as is conventional in a memory array. Cells arranged in each row are coupled to the corresponding one-out-of-x wordlines (WLs), which is decoded by the corresponding one-out-of-x row decoders (RDECs) 10A. The RDEC 10A is driven by the predecoded addresses 22, the drivers of which are located at the PDEC 13. Sense amplifiers (SA) 18 are located between the adjacent blocks 16.

Figure 1C:
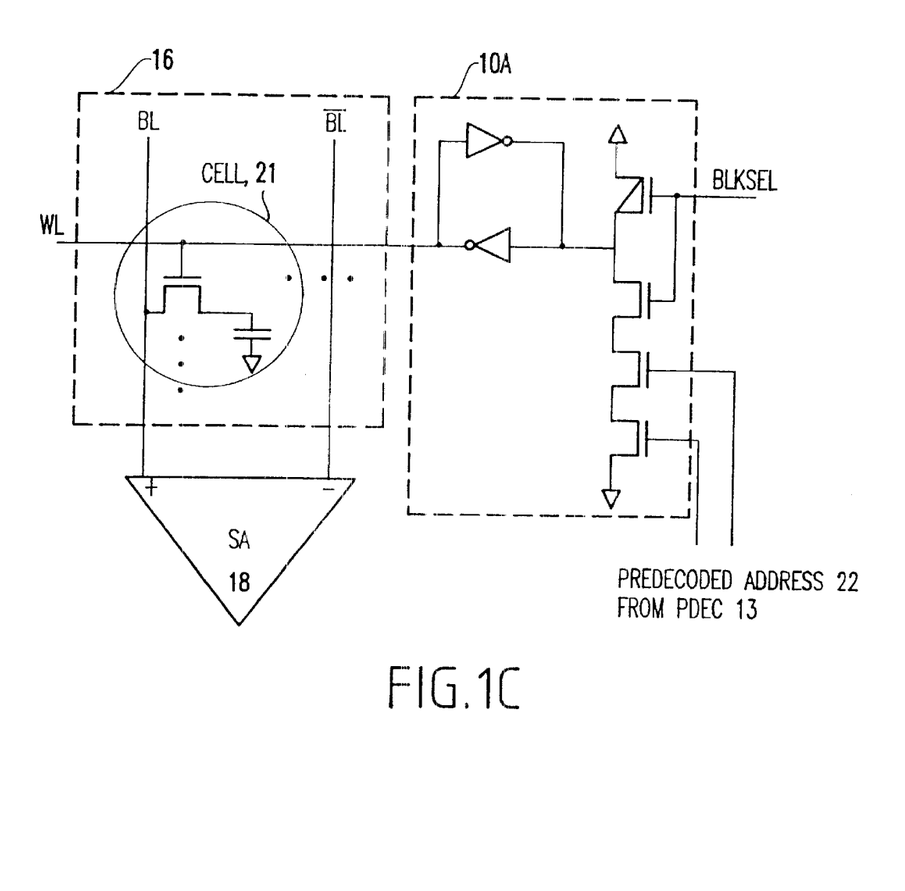

FIG. 1C is a block and circuit schematic showing a memory cell 21 within block 16, its connection to SA 18 and the transistors which make up RDEC 10A which drives the wordline (WL). For ease of illustration, the wordline driver has not been shown in FIG. 1C.

The read mode operation of the circuit shown in FIG. 1B will now be described. When the row address strobe (RAS) signal (not shown) is enabled, the peripheral circuits 15 drive addresses 20. The addresses 20 are predecoded by the PDEC 13, which drives the predecoded addresses 22. The block select signal (BLKSEL) triggers the activation of the WL by enabling RDEC 10A. When the predecoded addresses 22 are enabled for a particular RDEC 10A, upon receipt of the enabled BLKSEL at the RDEC 10A, signals which activate the corresponding WL is provided to the WL driver (not shown). With the RDEC circuit scheme shown in FIGS. 1B and 1C, the time at which the WL starts to rise and the time at which the WL starts to fall are controlled by the leveled block select signal BLKSEL.

The BLKSEL signal is also used to activate SA 18 at a controlled time after the activation of the WL to latch the data on a complementary bitline pair (BL,/BL). An independent BLKSEL signal is generated for each block 16. Generating the BLKSEL signal is therefore the key to controlling the block 16 to activate the WL and the SA 18 at their proper respective times.

Figure 2A:
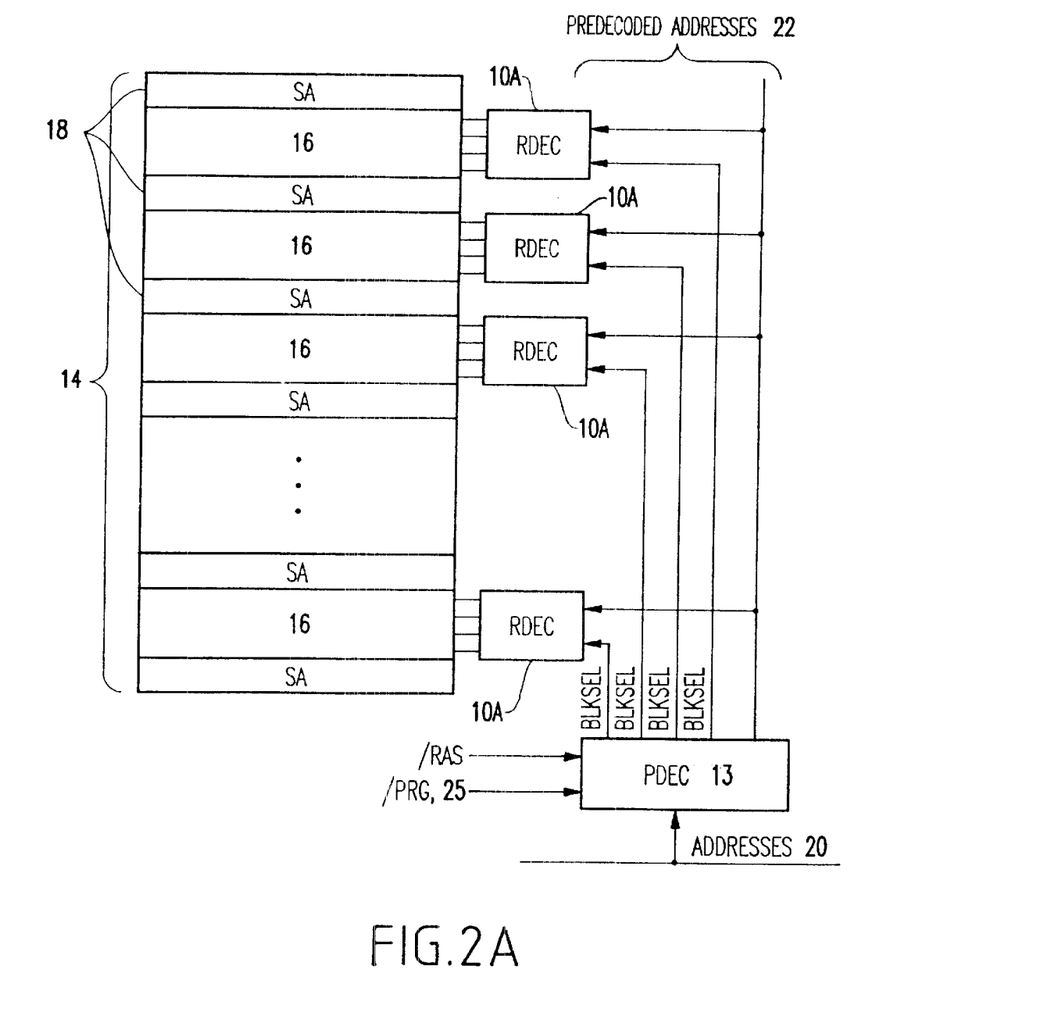
FIG. 2A is a block and schematic diagram of a portion of a memory unit in a DRAM configured as a single bank.

FIG. 2A is a block diagram showing a circuit arrangement in which predecoded addresses 22 are used as the BLKSEL signal. Such arrangement is described in detail in the article by Y. Watanabe et al entitled "A 286 mm$^2$ 256 Mb DRAM with ×32 Both-Ends DQ," JSSC, Vol. 31, No. 4, April 1996, pp. 567–574. The 64 Mb unit 14 includes sixteen 4 Mb blocks 16, each block which includes 1024 WLs. In order to select and activate one wordline out of the 16,384 wordlines in the 64 Mb unit (sixteen blocks per unit ×1024 WLs per block), 14 address signals ADD<0:13> are used, where the most significant four address signals ADD<10:13> are assigned to generate the sixteen predecoded addresses. These sixteen predecoded addresses generated from ADD<10:13> are used as the BLKSEL signals to respective ones of each of the sixteen blocks 16.

The predecoded BLKSEL scheme shown in FIG. 2A requires that the number of signal conductors carrying predecoded addresses 22 be increased as the number of the blocks 16 increases within the 64 Mb unit. Thirty-two BLKSEL signal conductors are required for the 128 Mb double unit 11, requiring an area of approximately 100 um$^2$, which is almost one quarter the area of the row decoder block 10.

The scheme shown in FIG. 2A also requires that other predecoded addresses 22 be held in an enabled state if one of the thirty-two blocks 16 is to be activated. With such signaling scheme, it is difficult to configure the memory with multiple banks. Multi-bank organization requires that blocks be controlled independently. However, the existing signaling scheme, which requires separate predecoded address lines for each bank, requires too many signal conductors, and is therefore not practical. Thus, the existing signaling scheme is practical only for a single bank design within a 128 Mb double unit 11.

Figure 2B:
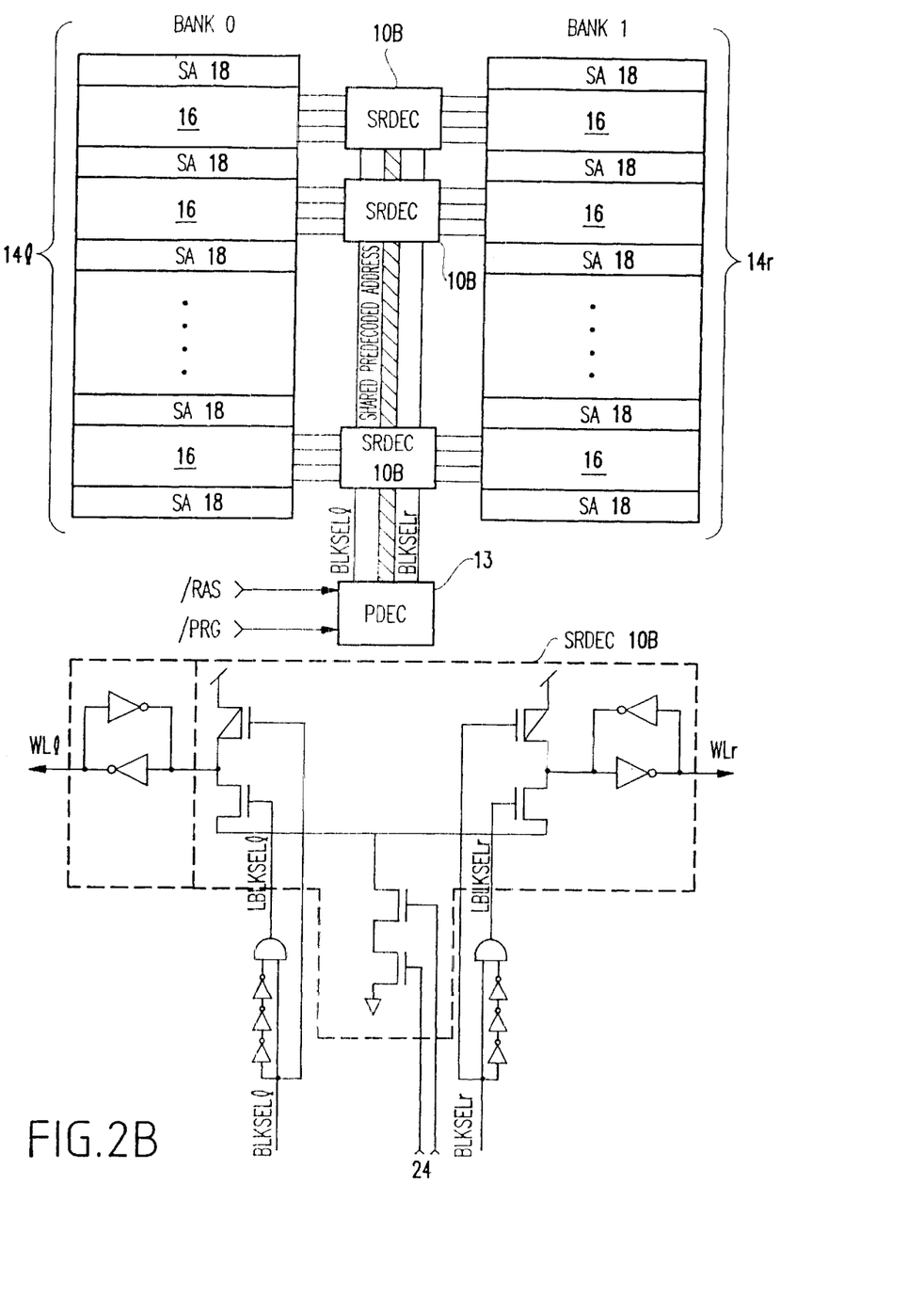
FIG. 2B is a schematic diagram of a memory unit in a DRAM having a shared row decoder and configured as two banks.

FIG. 2B is a block diagram showing a shared row decoder (SRDEC) 10B which allows the predecoded addresses 24 to be shared within two 64 Mb units 14l and 14r. The predecoded addresses 24 are used to generate the BLKSEL signals. This is referred to as a predecoded block select (BLKSEL) scheme. However, the time at which the wordline (WL) starts to rise is controlled by a local block select signal (LBLKSEL) in the form of a self-resetting pulse which is triggered by BLKSEL.

The LBLKSEL signal triggers the latching of the decoded address in the SRDEC 10B. The shared predecoded address signal lines 24 can then be used to access storage locations within the other bank. The time at which the wordline falls is controlled as in the predecoded BLKSEL approach. This makes is possible to configure the left and right 64 Mb units 14l and 14r as banks 0 and 1, respectively. However, this scheme has a similar problem to that of the decoding scheme shown in FIG. 2A in that the number of BLKSEL signal lines increases as the number of blocks 16 increases. In addition, the BLKSEL approach does not permit more than two banks to be configured within a single left or right unit, e.g. within either left or right 64 Mb unit shown in FIG. 2B.

Figure 2C:
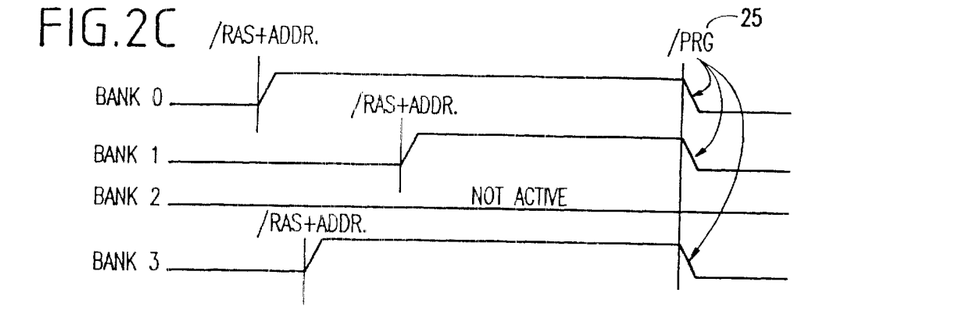
FIG. 2C is a signal timing diagram relating to the signals which flow through the structure illustrated in FIG. 2B.

When the principle of reducing the number of timing lines shown in FIG. 2B is applied to a single unit containing multiple banks, a problem arises in that individual banks cannot be reset at different times. This is illustrated in the timing diagram shown in FIG. 2C. When the precharge signal /PRG is activated, all blocks 16 are reset upon the falling edge 25 of /PRG, even though more than one bank is configured within the unit. Such simultaneous resetting contradicts the requirement that every bank be individually activated (set) and precharged (reset). The invention which will be described below overcomes this problem and allows the precharge signal to be controlled separately for each bank of a multiple bank unit of a DRAM.

By contrast, in the present invention described below, there is no limit to the number of banks which can be configured within a single left or right memory unit, for example the right 64 Mb unit 14r shown in FIG. 2B. Moreover, the invention described in the following provides a way to reduce the total number of required predecoded address signal lines irrespective of the number of blocks configured within a single left or right memory unit.

Accordingly, it is an object of the present invention to provide a method of activating a wordline in a hierarchical manner.

Another object of the invention is to provide a circuit which activates a local block within a double unit 11 of a memory in a hierarchical manner.

Another object of the invention is to permit the independent activation and resetting of individual banks within a multi-bank DRAM.

SUMMARY OF THE INVENTION

The inventive bank selection method and circuit adopt a hierarchical banking control concept for local activation of a block within a chip's double unit 11. This activation is achieved by reducing the total number of Wordline (WL) activation timing signals that are required to raise and reset the WL in each memory array bank.

More specifically, the invention proposes a structure of the double unit 11 including a plurality of banks, each of the banks including a plurality of blocks, a plurality of dedicated bank address lines carrying leveled WL activation timing information (with the high state for WL high and the low state for WL low) connected to all of the blocks in respective ones of the banks (the number of the dedicated bank address lines being equal to or more than the number of the banks in the double unit 11), and a plurality of shared address lines connected to all or at least two of the blocks in the double unit 11.

The dedicated bank address lines containing leveled WL activation timing information identify a selected bank. The shared address lines identify the selected block within the selected bank and a particular wordline within a block. The shared address lines are shared between at least two blocks in at least two different banks in the double unit 11.

Each of the blocks includes a conditional receiving latch circuit (CRLC) to generate a leveled block select signal LBLKSEL, which passes the leveled WL activation timing information carried on the respective one of the bank address lines, if the respective one of the decoded block address is valid during the set phase (low to high on the respective one of the bank address lines). Once activated, the reset timing of LBLKSEL depends only on the reset timing of the respective one of the bank address lines. Each of the blocks also includes a plurality of the row decoder circuits receiving the WL activation timing information from the latch circuit CRLC and shared row information from the respective one of the shared row address lines.

The address lines to select a particular word line in a block are shared between at least two blocks in at least two different banks within the double unit 11, and each of the blocks drives a plurality of wordlines. The shared address lines may have a certain degree of decoding done at the predecoders PDEC 13.

With the invention, timing information is transferred from one bank hierarchy to the next on predecoded/scrambled addresses. This allows the invention to use only one dedicated predecoded bank address line carrying leveled WL activation timing information per bank in the multibank DRAM architecture and to multiplex other non-timing predecoded addresses in the row path for local block descrambling.

Thus, the invention reduces the number of critical timing signal lines which conventionally run all the way from the row decoder to each memory block (for a distance of about 8 mm in the example discussed above). Conventionally there may be up to 320 of these lines (i.e. 10 address lines for each of the 32 blocks in the double unit). The invention reduces the number to 4, by multiplexing the timing information onto just 4 combined address/timing information lines (e.g., lines 300–350 in FIG. 3), and perform a local demultiplexing operation with a block selection signal.

Since the rest of the predecoded address signals (e.g., lines 310 in FIG. 3), which are required to activate every 2 Mb block, do not carry any timing-related data, they can be shared between several banks. These addresses are multiplexed into just 5 signals ($\log_2$ 32) and descrambled in the Row Control portion of the chip using the decoding circuit shown in FIG. 4. Thus, with the invention, the conventional area penalty required to drive slow timing-carrying signals to each of the blocks is eliminated and the row decoder's performance is improved.

In summary, the present invention is directed to a memory structure having hierarchical bank control, said structure comprising:

a plurality of banks, each of said banks including a plurality, of blocks;

a plurality of predecoded bank timing critical address lines that carry block activation timing information, said predecoded bank timing critical address lines being connected to different ones of said banks and being connected to all of said blocks within a respective bank of said banks, a number of said predecoded bank timing critical address lines being equal to a number of said banks; and a plurality of dedicated address lines connected to respective ones of said blocks.

The memory structure in accordance with the present invention further comprises a plurality of shared address lines connected to all of said blocks.

Also, in accordance with the present invention, said timing critical address lines identify a selected bank having a selected block.

In another aspect of the present invention, said dedicated address lines and said shared address lines identify said selected block within said selected bank.

Further in accordance with the present invention, each of said blocks includes a self-timed latch circuit connected to a respective one of said predecoded bank timing critical address lines. In another aspect according to the present invention, each of said blocks includes a shared row decoder circuit receiving timing information from said conditional receiving latch circuit and row information from a respective one of said dedicated address lines. In accordance with another aspect of the present invention, a number of said dedicated address lines is equal to a number of said blocks. According to another aspect of the present invention, each of said blocks drives a plurality of wordlines and said memory structure comprises a dynamic random access memory structure.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 3A:
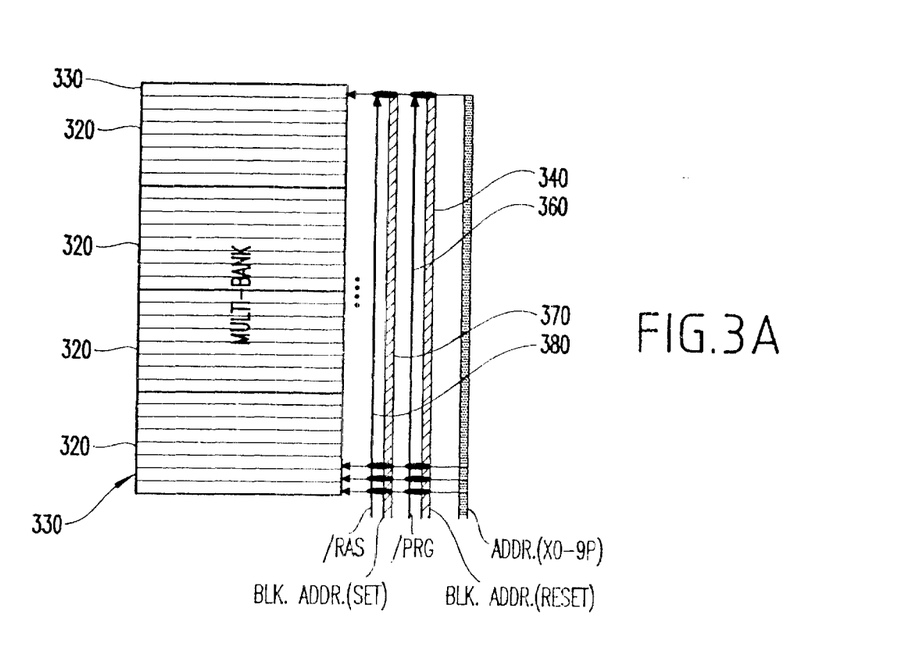
FIGS. 3A, 3B and 3D are schematic diagrams of a multi-bank DRAM having four banks according to the invention.

One possible solution to the problem of not having every bank individually activated (set) and precharged (reset), discussed in the background section, is to provide an additional block reset address line 340 which is latched with the precharge signal 360 and an additional block set address line 370 which is latched with the row address strobe signal 380, as shown in FIG. 3A. Such a structure specifically identifies, by address, which block is to be set or reset. However, this solution requires a large amount of wiring space and mandates that latching be performed at the block level. The area savings of the structure shown in FIG. 3A are almost completely consumed by introducing the additional address buses 340, 370 for the word line (WL) reset phase.

Figure 3B:
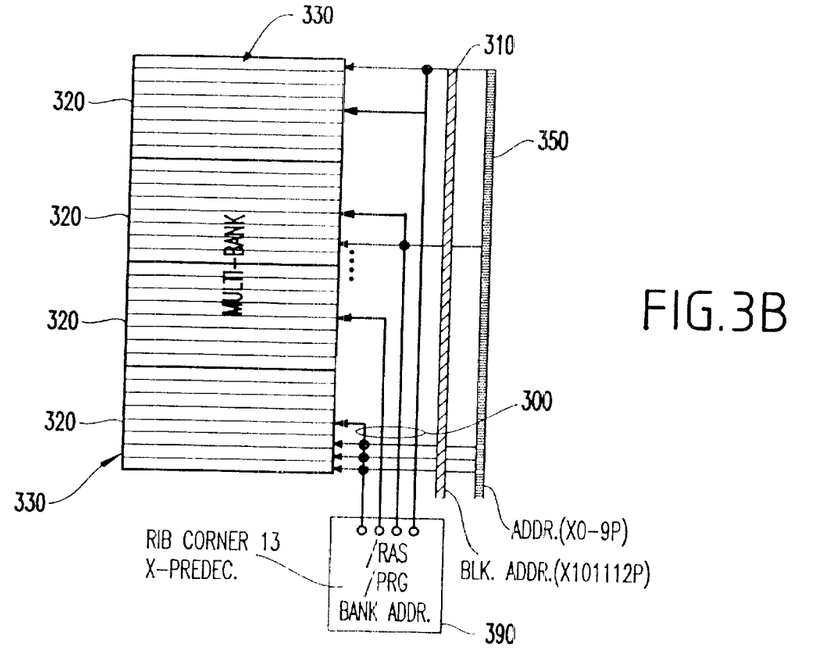
Figure 3C:
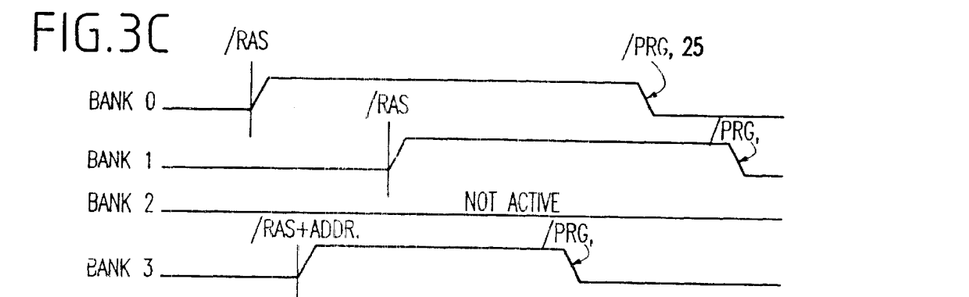
FIG. 3C is a signal timing diagram relating to the signals which flow through the inventive structure illustrated in FIG. 3B.
Figure 6:
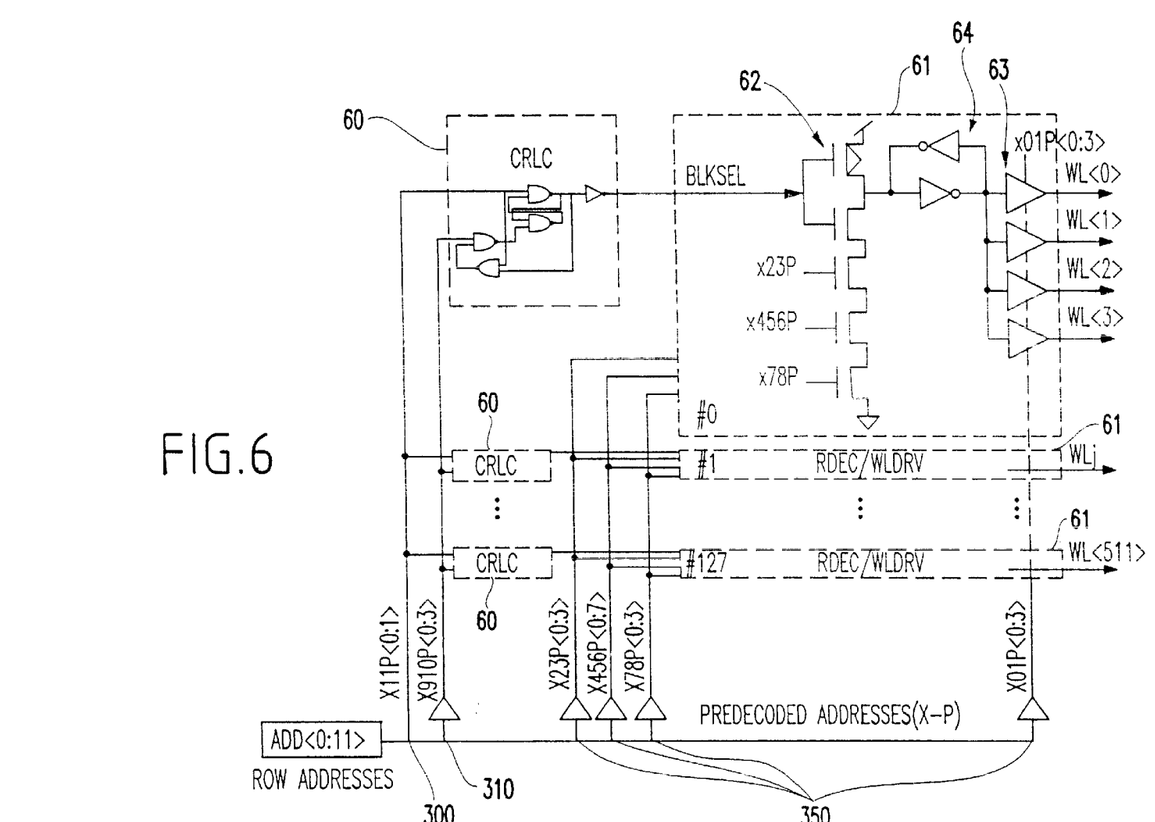
FIG. 6 is a schematic diagram of a sub-array according to the invention.
Figure 7:
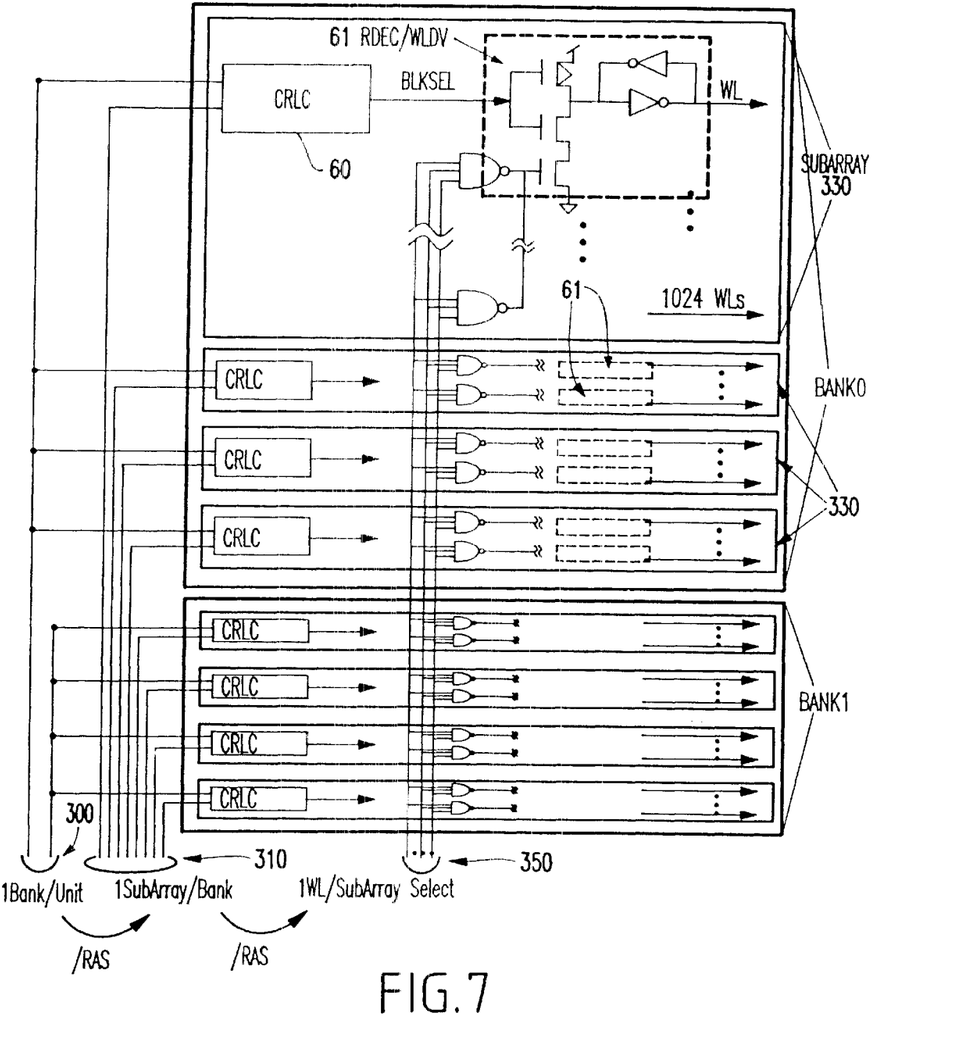
FIG. 7 is a schematic diagram of banks within a multi-bank DRAM having sub-arrays according to the invention.

Another more workable solution is the embodiment of the invention illustrated in FIG. 3B. This same concept is described in more detail with reference to FIGS. 6 and 7, discussed below. The structure in FIG. 3B includes four banks 320, while FIGS. 6 and 7 illustrate only two banks in order to describe the invention in greater detail.

For simplicity, the normal address bus (X0-9P) will be ignored in the following discussion since predecoding/decoding of these signals is identical for every case (e.g., all cases have same number of WLs in a given block). In this example one WL is decoded out of 1024.

Referring now in more detail to FIG. 3B, a separate timing line 300 is provided to each bank 320. The timing line 300 carries /RAS and also /PRG information by having a "level-type" control. "Level-type" means that upon transition from low to high, a SET operation is enabled (via /RAS) and during the high to low phase a RESET is enabled.

The four bank select timing signals 300 are latched with the /RAS and the /PRG and the bank address in the rib corner (X-Predecoder) 390 (item 13 in FIG. 1). The bank addresses required for decoding the bank select signals are already decoded in the rib corner 390 and therefore need not be sent along the full length of rib with the other predecoded addresses (X0-9P) 350.

The bank select signals 300 are latched with the block address 310 (X10-12P -8 blocks per bank) via a Self-Timed Latch Circuit 60 (SLTC) shown in FIG. 6, in order to transfer the timing to each individual blocks 330 within a bank 320. The total number of lines required for this multi-bank SDRAM is therefore 12 (4 timing bank select lines 300+8 predecoded block addresses X10112<0:7>310 (i.e. 12)), not counting the normal addresses (X0-9P) 350. This is two lines less than required for the conventional single bank asynchronous decoding structure shown in FIG. 2B, (i.e., 14) which does not utilize multiple bank activation and precharging principles.

FIGS. 6 and 7 are more detailed illustrations of the multi-bank structure shown in FIG. 3B. However, in order to illustrate a higher level of detail, the structure in FIG. 7 includes only two banks (bank 0, bank 1) and each bank includes only 4 blocks 330. As would be known by one ordinarily skilled in the art, the structures illustrated in FIGS. 3B and 7 are substantially similar. However, different addressing is required in the different structures because of the different number of banks and different number of blocks within each bank. One of the blocks 330 is illustrated in greater detail in the upper section of FIG. 7. An even more detailed illustration of block 330 appears in FIG. 6.

Figure 4:
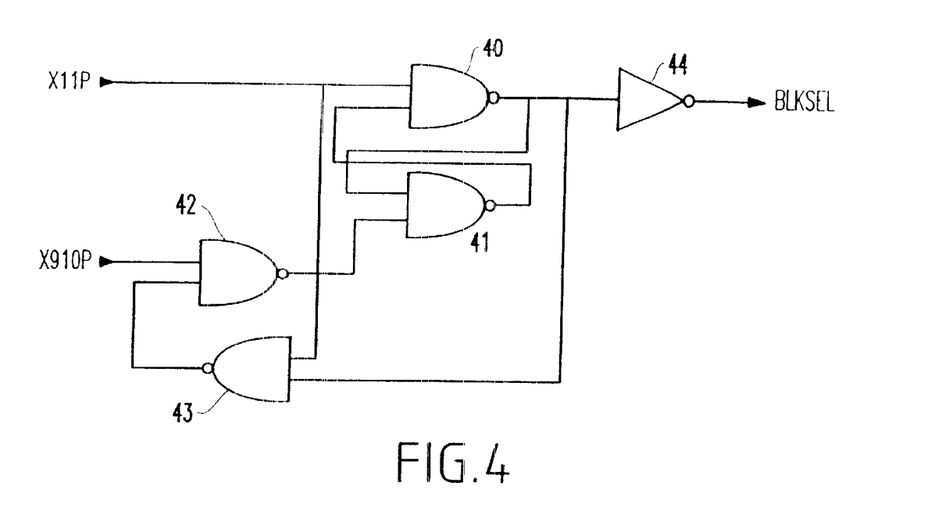
FIG. 4 is a schematic diagram of a circuit for generating a block select signal according to the invention.

FIG. 4 illustrates the details of the self timed latch circuit 60 shown in FIGS. 6 and 7. More specifically, FIG. 4 illustrates NAND circuits 40–43 and inverter 44. In the example shown in FIG. 4, signal X11P (delayed X-address of external chip address A11) carries bank timing information for decoding one-half of the banks in the unit.

The invention uses hierarchical banking control, to transfer timing information to the smallest memory bank in the hierarchy via multiplexed addresses that transfer timing information from one level of decoding addresses to the next. As shown in FIG. 7, in order to transfer the timing required to activate a single wordline WL, a first bank (e.g., bank 0) is decoded using the timing signal 300, then a single memory block 330 is decoded in the bank (e.g., using 1:4 decoding, discussed below) by transferring the timing signal 300 (e.g., a slightly delayed RAS from previous stage decoding) through the conditional receiving latch circuit 60, and lastly a third hierarchical decoding occurs in a shared row decoder circuit 61, where a single wordline WL is being activated (e.g., using 1:1024 decoding).

Initially, a predecoded address signal 300 containing timing information is exercised in the first level of hierarchal decoding to activate a single bank (e.g., bank 0) of the unit, and then the address signal 300 is multiplexed with other static predecoded addresses 310 that may continuously change independently of the bank address.

Referring again to FIG. 3B, the latch/decode circuit 340 latches the timing information hierarchically during the bank addressing process and generates necessary block select signals. In other words, the latch 340 uses time-dependent input from the first level of decoding to generate time-dependent output in a subsequent level of decoding.

Referring again to FIGS. 4 and 6, signal X910P (shared predecoded external addresses A9 and A10) is a DC address signal 310 that is used to decode 1 out of 4 active block(s) within one bank. If the bank is active, the one active block is decoded or identified by asserting high either X910P<0>, X910P<1>, X910P<2> or X910P<3>. By asserting a bank address (X11P) either high or low, either the upper or lower bank is activated.

The X11P signal is input into NAND circuits 40 and 43. The output of NAND circuit 40 is output to NAND circuit 41 and to NAND circuit 43. NAND circuit 42 receives, for example an X910P signal and an output from NAND circuit 43. In turn, NAND circuit 41 receives the output from NAND circuit 42 and outputs to NAND circuit 40, which output is inverted by inverter 44 and output as the block selection signal BLKSEL. The logical operation of the circuit illustrated in FIG. 4 is explained with reference to the timing diagram illustrated in FIG. 5.

Figure 5:
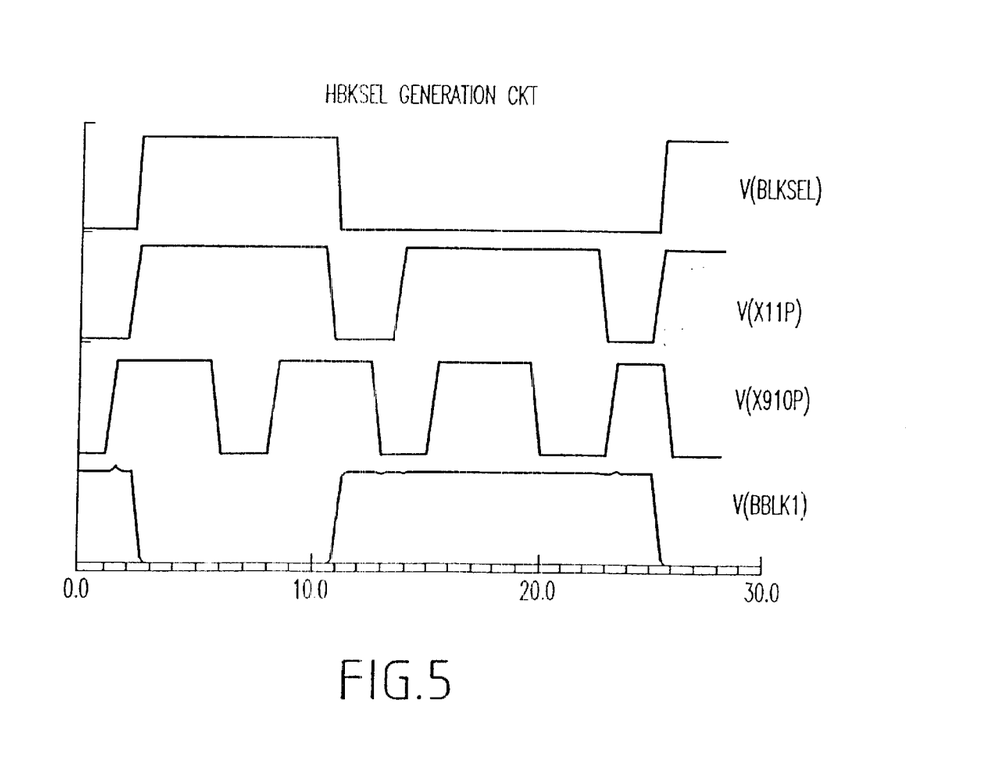
FIG. 5 is the timing diagram of signals generated by the circuit illustrated in FIG. 4, according to the invention.

In FIG. 5, when time-dependent X11P is high, and X910P is also high, the block select signal BLKSEL signal will follow the timing signal until X11P signal falls, independently of the next change that might occur in X910P. When both inputs to NAND 40 are high, its output is low, hence, the feedback loop (e.g., 41,43) guarantees the second input of 40 to be high, because one of the inputs to NAND 41 is always low.

However, if X11P is high and X910P is low (which indicates that no block within a given bank is to be selected), then the block select signal BLKSEL will remain low even if X910P becomes high during the X11P high pulse. This is due to this address being shared between several banks. However the X11P pulse fed into the circuit is relevant to the active bank only.

Therefore, the invention essentially masks out any X910P address change after the bank is set. When the bank is set, the BLKSEL signal serves to control the activation of the row decoder 62 along with a WL driver 63.

The decoding NAND gate 42, which inputs the predecoded X910P non-timing dependent address, is not limited to receiving only one address signal and may receive as many static addresses as is required to activate an array block of any chosen size.

Thus, the conditional receiving latch circuits 60 decodes timing information from the block select signal BLKSEL using predecoded addresses, such as the X11P signal (which is the timing predecoded signal) and the X910P signal, (which is the predecoded signal shared between several banks) as inputs.

The BLKSEL signal is then fed into a Row Decoder/WordLine Driver "RDEC/WLDRV" 61. In the example shown in FIG. 6, there are 128 row decoder/wordline drivers 61. Each of the row decoder/wordline drivers 61 includes stacked decoding N-type field effect transistors (NFET) stages 62 that accept lower order (X910P and X11P are high order addresses used by the SLTC circuit to generate timing signal BLKSEL to enable the Row Decoder 62) shared predecoded addresses X23P, X456P, X78P (required to activate a single Row Decoder out of 128) and a latch 64 (2 feedback inverters) that latches the data and activates wordline drivers 63.

In the example shown in FIG. 6, each of the row decoder/wordline drivers 61 includes four wordline drivers 63. As would be known by one ordinarily skilled in the art, the wordline drivers 63 could be, but are not limited to, simple reset devices stacked in a 1/4 decoding fashion (e.g., a 1/8, etc. decoding fashion is also possible). The X01P signal is used to activate one out of 4 WL drivers. The X01P signal is predecoded out of 2 addresses A0 and A1. Thus, 4 combinations are possible, X01P<0>, X01P<1>, X01P<2>, X01P<3>, each of which goes to a single WL driver.

The X910P<0:3> signal is used to select one out of four subarrays 330 and the X11P signal is used to select 1 out of 2 banks.

Therefore, as shown in FIG. 7, three decoding bands of signal lines 300, 310 and 350 are all that is required to transfer timing information into the row decoder to activate a wordline. The first band of signal line 300 selects either one of the two banks. In this example, only one timing predecoded address is required, (i.e X11P<0/1> ("0" selects upper and "1"—lower bank). Then, the timing signal from the first band of signals 300 is fed into an STLC 60 as one input where the second band of signals 310 of predecoded addresses (X910P<0:3>) serves as a second input of SLTC.

The STLC circuit allows the timing signal to be transferred to the second addressing band 310. Lastly, in order to activate only one wordline in a 4 Mb memory sub-array, 9 shared predecoded addresses 350 (X01P<0:3>, X23P<0:3>, X456P<0:7> and X78P<0:3> (e.g., 4+4+8+4=20 lines)) are supplied.

The address lines 350 constitute a third hierarchical address band of signal lines 300 and are used to activate row decoders 62 and wordline drivers 63, as shown in FIG. 6. Timing information detained by the block select signal (BLKSEL), is output and in turn orders the wordline to rise (e.g., to become active).

The conventional systems provide predecoded block select signal BLKSEL lines for each of the blocks that exist on an integrated circuit IC. Therefore, conventionally the number of timing critical signal lines is equal to the number of banks multiplied by the number of blocks per bank. To the contrary, the invention only provides one predecoded bank select signal line for each bank that exists on an integrated circuit. Thus, in a four bank, eight block per bank design, with conventional structures, the number of block select timing signal lines is 32, whereas the invention needs just 4 bank select timing signal lines.

The invention does not introduce. any extra wiring channels, which reduces total chip area. Further, the invention achieves the ability to have every bank individually activated (set) and precharged (reset) at any time, as is required in multi-bank SDRAM., as discussed above.

Figure 3D:
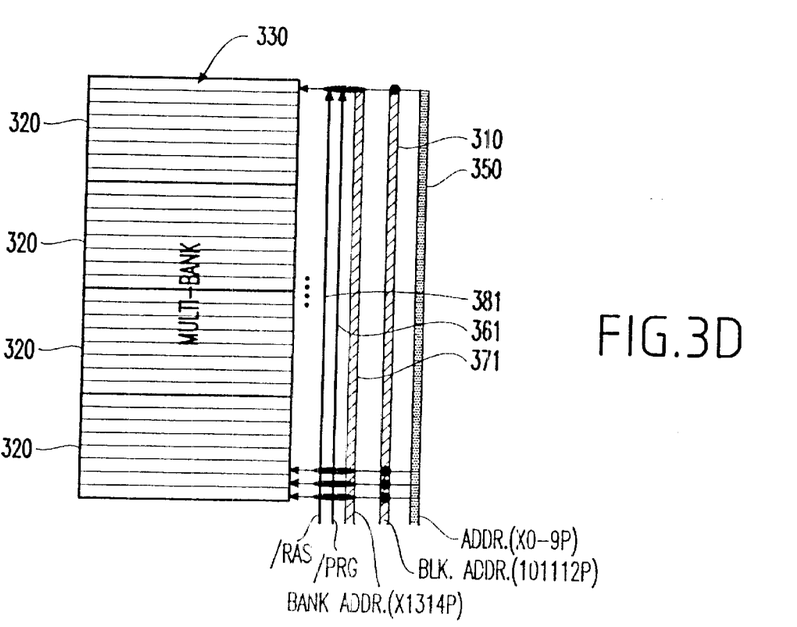

In another embodiment of the invention shown in FIG. 3D, the timing signals (/RAS 381 and /PRG 361) are combined with the bank address signal 371 and are latched locally within each bank 320. The bank activation timing signal 371 latches the valid block address locally for each block 320. This embodiment requires additional wiring channels in the rib region 10 and additional latches in the rib corner 13 to latch the bank address 371 with /RAS 381 and /PRG 361, as shown in FIG. 3D.

Therefore, with the structure illustrated in FIG. 3A the bank is essentially selected on the basis of the block address signals 340, 370, combined respectively with the RAS signal 380 and PRG signal 360. To the contrary, in FIG. 3D the bank address information 371 is combined with the RAS and PRG signals 361, 381 which are latched locally within each block 330.

In addition, with the invention, the row decoder 10 is shared between two units 14. Therefore, the rib unit 10 in FIG. I becomes a "shared rib" 10 within a 128 Mb Double Unit 11 with the invention. Because row decoder 10 is shared, the normal address X0-9P 350 can also be shared for two units 14, thus eliminating the penalty of providing separate X0-9P addresses for each unit 14 in order to decode a wordline.

Thus, with the invention, the conventional area penalty required to drive slow time-carrying signals to each of the blocks is eliminated and the row decoder's performance is improved.

While two- and four-level multi-banked structures are discussed in the examples used in this application, as would be known by one ordinarily skilled in the art given this disclosure, the inventive hierarchical banking control method can be applied to a DRAM chip with any number of banks. However, as again would be known by one ordinarily skilled in the art, the addressing would have to be changed in order to activate the correct number of sub-arrays and their respective wordlines, depending upon the specific application involved.

Also, while the invention has been described in terms of preferred embodiments, those skilled in the art will recognize that the invention can be practiced with modification within the spirit and scope of the appended claims.

What is claimed is:

1. A memory structure having hierarchical bank control, said memory structure comprising:
a plurality of banks, wherein each one of said plurality of banks includes
a plurality of word lines, wherein only one of said plurality of word lines within said each one of said plurality of banks can be activated at a time, and wherein
each one of said plurality of banks is subdivided into a number of blocks within a bank, wherein each one of said blocks within a bank comprises a subset of said plurality of word lines;
a plurality of bank timing lines wherein a respective one of said bank timing lines is coupled to a respective one of said plurality of banks in a one-to-one relationship; and
a plurality of block lines, said plurality of block lines being equal in number to said number of said blocks within a bank, wherein each of said plurality of block lines is coupled to and shared with all of said plurality of banks, and
wherein within each one of said plurality of banks,
each of said blocks within a bank is coupled to and shared with said respective one of said bank timing lines, and a respective one of said plurality of block lines is coupled to said blocks within a bank in a one-to-one relationship with a respective one of said blocks within a bank.

2. The memory structure of claim 1, wherein said plurality of bank timing lines carries bank timing information and wherein said plurality of block lines carries predecoded block address information.

3. The memory structure of claim 1 wherein each one of said blocks within a bank further comprises:
a signal generating device; and
at least one row decoder,
wherein said at least one row decoder is coupled to said subset of word lines.

4. The memory structure of claim 2 wherein said bank timing information further comprises a set operation time and a reset operation time.

5. The memory structure of claim 4 wherein at said set operation time, said bank timing information and said predecoded block address information is combined to generate a block select signal.

6. The memory structure of claim 3 wherein said plurality of bank timing lines carries a set operation time and a reset operation time.

7. The memory structure of claim 6 wherein at said set operation time, a predecoded block address is provided by said plurality of block lines so that said signal generating device generates a block select signal.

8. The memory structure of claim 7 wherein upon generation of said block select signal, a selected row address is provided, so that a selected word line is activated in accordance with said selected row address.

9. The memory structure of claim 5 wherein upon generation of said block select signal, a selected row address is provided, so that a selected word line is activated in accordance with said selected row address.

10. The memory structure of claim 3 wherein a selected word line address is hierarchically decoded by said signal generating device in cooperation with said at least one row decoder and a selected word line is activated in accordance with said selected word line address in a time period defined by information carried in said plurality of bank timing lines.

11. A memory structure having hierarchical bank control, said memory structure comprising:
a plurality of banks, wherein each one of said plurality of banks includes
a plurality of word lines, wherein only one of said plurality of word lines within said each one of said plurality of banks can be activated at a time, and wherein
each one of said plurality of banks is subdivided into a number of blocks within a bank wherein each one of said blocks within a bank further includes
a signal generating device,
a subset of said plurality of word lines, and
at least one row decoder,
wherein said at least one row decoder is coupled to said subset of word lines;
a plurality of bank timing lines wherein a respective one of said bank timing lines is coupled to a respective one of said plurality of banks in a one-to-one relationship; and
a plurality of block lines, said plurality of block lines being equal in number to said number of said blocks within a bank, wherein each of said plurality of block lines is coupled to and shared with all of said plurality of banks, and
wherein within each one of said plurality of banks,
each of said blocks within a bank is coupled to and shared with said respective one of said bank timing lines, and a respective one of said plurality of block lines is coupled to said blocks within a bank in a one-to-one relationship with a respective one of said blocks within a bank.

12. A memory structure having hierarchical bank control, said memory structure comprising:
a plurality of banks, wherein each one of said plurality of banks includes
a plurality of word lines, wherein only one of said plurality of word lines within said each one of said plurality of banks can be activated at a time, and wherein
each one of said plurality of banks is subdivided into a number of blocks within a bank wherein each one of said blocks within a bank further includes
a signal generating device,
a subset of said plurality of word lines, and
at least one row decoder,
wherein said at least one row decoder is coupled to said subset of word lines;
a plurality of bank timing lines wherein a respective one of said bank timing lines is coupled to a respective one of said plurality of banks in a one-to-one relationship; and
a plurality of block lines, said plurality of block lines being equal in number to said number of said blocks within a bank, wherein each of said plurality of block lines is coupled to and shared with all of said plurality of banks, and
wherein within each one of said plurality of banks,
each of said blocks within a bank is coupled to and shared with said respective one of said bank timing lines, and a respective one of said plurality of block lines is coupled to said blocks within a bank in a one-to-one relationship with a respective one of said blocks within a bank, and
wherein a selected word line address is hierarchically decoded by said signal generating device in cooperation with said at least one row decoder and a selected word line is activated in accordance with said selected word line address in a time period defined by information carried in said plurality of bank timing lines.

* * * * *